(12) United States Patent
Toyota et al.

(10) Patent No.: US 10,104,765 B2
(45) Date of Patent: Oct. 16, 2018

(54) PRINTED WIRING BOARD AND METHOD OF PRODUCING THE SAME

(71) Applicants: National University Corporation Okayama University, Okayama-shi, Okayama (JP); KYOCERA Circuit Solutions, Inc., Kyoto (JP)

(72) Inventors: Yoshitaka Toyota, Okayama (JP); Kengo Iokibe, Okayama (JP); Yuki Yamashita, Okayama (JP); Masanori Naito, Fuchu (JP); Toshiyuki Kaneko, Hachioji (JP); Kiyohiko Kaiya, Yokohama (JP); Toshihisa Uehara, Zama (JP); Koichi Kondo, Sendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/010,733

(22) Filed: Jan. 29, 2016

(65) Prior Publication Data
US 2016/0227643 A1    Aug. 4, 2016

(30) Foreign Application Priority Data

Jan. 30, 2015 (JP) ................................. 2015-017995

(51) Int. Cl.
*H05K 1/02* (2006.01)

(52) U.S. Cl.
CPC ..... *H05K 1/0236* (2013.01); *H05K 2201/086* (2013.01); *H05K 2201/09972* (2013.01)

(58) Field of Classification Search
CPC ....................... H05K 2201/086; H05K 1/0236
See application file for complete search history.

(56) References Cited

U.S. PATENT DOCUMENTS

| 7,939,907 | B2 * | 5/2011 | Osaka | H01L 23/66 |
| | | | | 257/500 |
| 9,099,764 | B2 * | 8/2015 | Sasaki | H05K 1/0236 |
| 9,648,794 | B2 * | 5/2017 | Rokuhara | H05K 9/0064 |
| 2008/0158840 | A1 * | 7/2008 | Chen | H05K 1/0236 |
| | | | | 361/782 |

(Continued)

FOREIGN PATENT DOCUMENTS

| JP | 2008-131509 A | 6/2008 |
| JP | 2010-199881 A | 9/2010 |
| JP | 2013-183082 A | 9/2013 |

OTHER PUBLICATIONS

Toyota, Y., et al., "A Study of Planar EBG Structure with Ferrite Thin Film for Practical Use," Okiyama University, Journal of 28th Spring Meeting, Japan Institute of Electronics Packaging, Mar. 5, 2014, 5 pgs., with concise English Translation-in-Part.

*Primary Examiner* — Nathan Milakovich
(74) *Attorney, Agent, or Firm* — Volpe and Koenig, P.C.

(57) ABSTRACT

A printed wiring board includes a digital circuit, an analog circuit, and a power supply path that is disposed on an insulating layer between the digital circuit and the analog circuit. EBG unit cells are disposed on a boundary between the digital circuit and the analog circuit one dimensionally or two dimensionally and periodically, and an interdigital electrode is formed. A magnetic body film is formed over the printed wiring board, partially formed on the EBG unit cells, or formed avoiding the EBG unit cells.

9 Claims, 9 Drawing Sheets

(56) References Cited

U.S. PATENT DOCUMENTS

| | | | |
|---|---|---|---|
| 2010/0103639 A1* | 4/2010 | Pulugurtha | H05K 9/0083 361/818 |
| 2010/0180437 A1* | 7/2010 | McKinzie, III | H01P 1/20 29/825 |
| 2010/0214178 A1 | 8/2010 | Toyao et al. | |
| 2010/0265159 A1* | 10/2010 | Ando | H01Q 9/0421 343/913 |
| 2011/0147063 A1* | 6/2011 | Kwon | H05K 1/0231 174/260 |
| 2013/0126227 A1* | 5/2013 | Ishida | H05K 1/0236 174/350 |
| 2014/0091879 A1 | 4/2014 | Toyao et al. | |
| 2014/0152520 A1 | 6/2014 | Toyao et al. | |
| 2015/0084167 A1* | 3/2015 | Sasaki | H01L 24/19 257/659 |
| 2016/0157338 A1* | 6/2016 | Toyota | H05K 1/0236 361/748 |

\* cited by examiner

PRINTED WIRING BOARD AND METHOD OF PRODUCING THE SAME

BACKGROUND OF THE INVENTION

1. Technical Field

The present invention relates to a printed wiring board that has an electromagnetic band gap (EBG) structure and a method of producing printed wiring board.

2. Background

To artificially control frequency dispersion of materials, structures in which conductor patches or the like are arrayed periodically have been proposed. Among these structures, an electromagnetic band gap (hereinafter, "EBG") structure has an ability to reduce propagation of electromagnetic waves in a specific frequency band of a printed wiring board and a device package board. The EBG structure having such a characteristic is applied to noise reduction and measures against interferences.

As examples of the EBG structure, a mushroom EBG structure having mushroom-shaped conductors, and a via-less EBG structure without using vias have been proposed.

A conventional multilayered printed wiring board is designed such that solid patterns having low impedance are formed on a power supply layer and a GND (ground) layer in order to stabilize an applied voltage and a supplied current.

However, when a digital circuit and an analog circuit are connected to the same power supply, not only direct-current (DC) connection but also high-frequency components are easily transmitted in typical solid patterns. For this reason, high-frequency components generated in the digital circuit are transmitted to the analog circuit as noises to cause problem. Specifically, standing waves are generated at a resonance frequency that depends on shapes of the power supply layer and the GND layer, and thus transmission characteristics are improved at a specific frequency in appearance. For this reason, when the resonance frequency matches with a frequency of a high-frequency noise to be generated in IC or the like, an operation of the analog circuit is greatly affected by the noise.

The following suggestion has been taken against the above problem of a high-frequency noise.

Japanese Unexamined Patent Publication No. 2008-131509 proposes an EBG structural body, in which slits are formed in the power supply layer of a printed wiring board. This EBG structural body is formed only with the power supply layer and thus requires no complex members, such as vias.

Japanese Unexamined Patent Publication No. 2010-199881 proposes a waveguide structure having an EBG structure, in which spiral wires of open stub structures are connected to a GND layer through vias. In this structure, input impedance of the open stub is connected between the power supply layer and the GND layer through vias. A noise block frequency is around a resonance frequency of the open stub whose impedance between the power supply layer and the GND layer become zero. For this reason, the block frequency can be controlled according to a length of the stubs for determining the resonance frequency. Since an occupied area of the stubs can be decreased by forming the subs into a spiral wire, this structure is suitable for a compact design.

Japanese Unexamined Patent Publication 2013-183082 proposes a multilayer printed wiring board in which a power supply is divided into multiple pieces having a patch shape. An open stub is connected to some of the divided pieces. Forming EBG with only a power supply layer realizes a compact design.

The report titled "Study for Planer EBG Structure with Ferrite Thin Film for Practice Use" which was written by Yoshitaka Toyota et al. at Okayama University and in Journal of 28th Spring Meeting in the Japan Institute of Electronics Packaging and was issued on Mar. 5, 2014, proposes noise measures using an EBG pattern with a meander line. Interconnecting patches in adjacent EBG cells with a meander wire can increase inductance. As a result, a compact design can be realized.

In the EBG structural body proposed in Japanese Unexamined Patent Publication No. 2008-131509, forming the slits in the solid pattern is expected to reduce the transmission of high-frequency components. However, when the solid pattern is separated completely by the slit, a DC power cannot be supplied. When the solid pattern is partially continuous with the power supply layer, EBG unit cells each having a size of about 16.5 mm per side are required for noise block in a band of 2.5 GHz to be used for wireless communication. Unfortunately, such large-sized unit cells are not applicable easily to portable electric devices, such as notebook PCs.

The waveguide structure proposed in Japanese Unexamined Patent Publication No. 2010-199881 involves additionally forming a layer in which the open stubs are to be formed. The connection between the wires of the open stubs and the GND layer needs the vias. For this reason, a step dedicated to forming the vias needs to be added to the producing process of the printed wiring board, and thus an overall cost rises.

In the multilayer printed wiring board proposed in Japanese Unexamined Patent Publication 2013-183082, the open stub is formed on the patch portions disposed periodically. As a result, the electromagnetic band gap structure, which has the block band where the propagation of electromagnetic waves in a specific frequency band is reduced, is proposed. In this method, since the block band depends on an electric length of the stub, the stub length should be increased in order to set the block band to a low frequency band. The use of the spiral wire for the stub decreases the occupation area and thus a compact design is realized. However, remaining of the patch portions makes a compact design insufficient, and a compact design that is realized by thinning a branch connecting the patches makes the DC power supply difficult.

In the report titled "Study for Planar EBG Structure with Ferrite Thin Film for Practice Use", which was written by Yoshitaka Toyota et al. at Okayama University and in Journal of 28th Spring Meeting in the Japan Institute of Electronics Packaging and was issued on Mar. 5, 2014, the EBG unit cells are interconnected by the meander lines. As a result, an inductance component is increased and thus a compact design of the EBG unit cells is realized. According to an embodiment, the EBG unit cells having a size of about 7 mm per side are required to take the measure against noises of 2.5 GHz band. Since an allowable current depends on a thickness of the meander lines, the meander lines should be thickened in order to supply a large electric current. This prevents the compact design of the EBG unit cells.

SUMMARY

It is an object according to the embodiment of the present invention to provide a compact EBG structure that can prevent a high-frequency noise to be generated in a digital circuit from being mixed in an analog circuit in an analog/digital hybrid circuit, a printed wiring board having a power supply layer with the EBG structure, and a method of producing the printed wiring board.

In a printed wiring board according to the embodiment of the present invention, a power supply path is disposed on an insulating layer between a digital circuit and an analog circuit, EBG unit cells are periodically arrayed on a boundary between the digital circuit and the analog circuit one-dimensionally or two-dimensionally, and an interdigital electrode is formed.

A method of producing a wiring board according to an embodiment of the present invention includes disposing a power supply path on an insulating layer between a digital circuit and an analog circuit, periodically arraying EBG unit cells on a boundary between the digital circuit and the analog circuit one-dimensionally or two-dimensionally, forming an interdigital electrode, and forming a magnetic body film on the EBG unit cells.

DETAILED DESCRIPTION

Figure 1A:
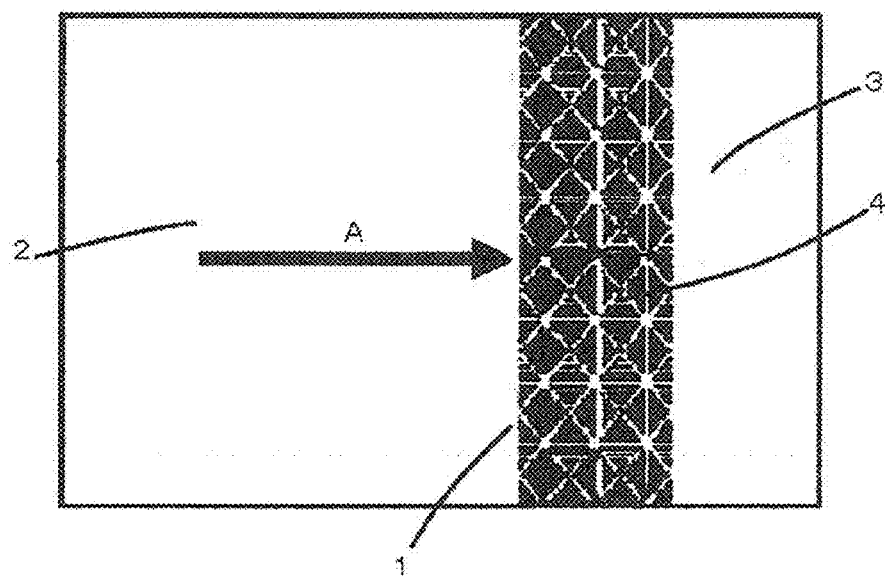
FIG. 1A is an explanatory diagram illustrating a printed wiring board according to one embodiment of the present invention in which two-dimensional IDE-EBG unit cells are arrayed between a digital circuit and an analog circuit two-dimensionally.

In a printed wiring board according to one embodiment of the present invention, as illustrated in FIG. 1A, an IDE-EBG 4 is disposed on a power supply layer 1 on a boundary between a digital circuit 2 and an analog circuit 3.

Figure 1B:
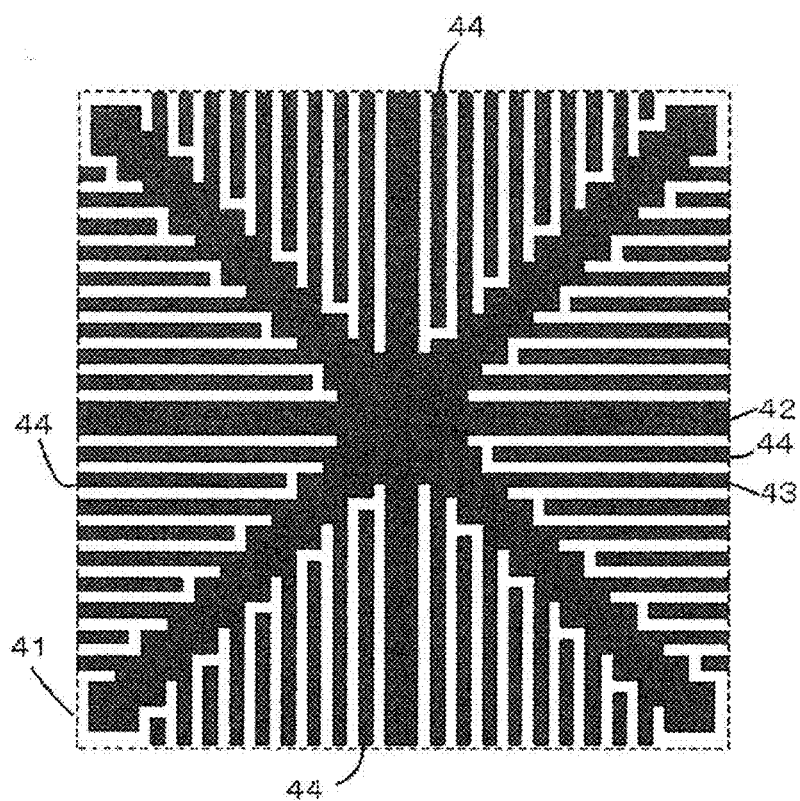
FIG. 1B is a partially enlarged diagram of FIG. 1A.
Figure 1:
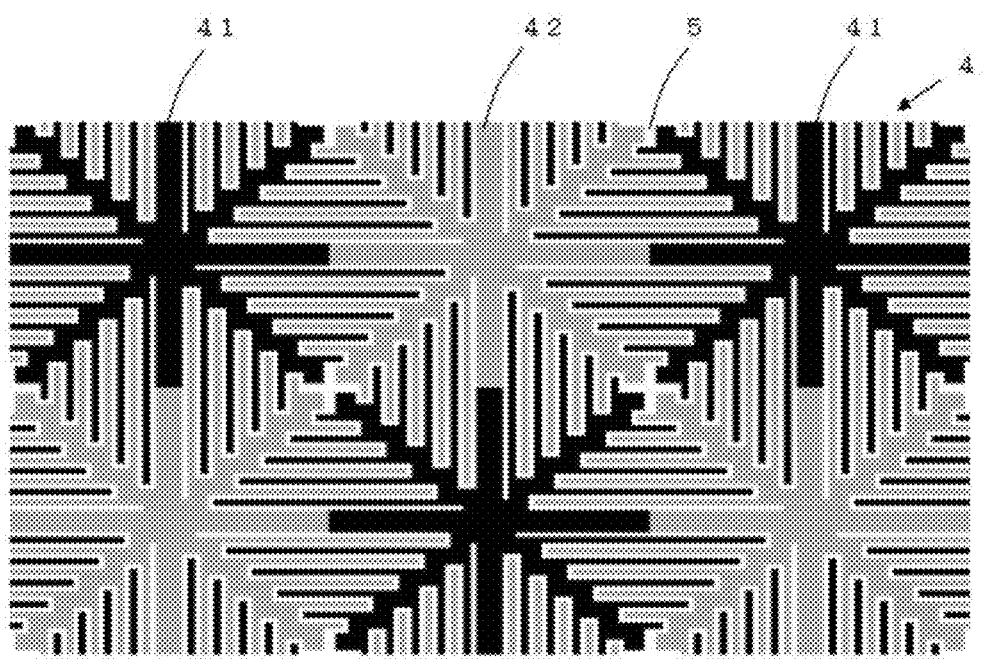
FIG. 1C is a partially enlarged diagram of FIG. 1A that depicts the interdigitated cells.

The IDE-EBG 4 formed on the printed wiring board is structured so that two-dimensional IDE-EBG unit cells 41 illustrated in FIG. 1B are disposed periodically and two-dimensionally.

In the two-dimensional IDE-EBG unit cell 41, an interdigital electrode is formed between bridge portions 42 and thin wire electrodes 44 of the EBG unit cell formed adjacently on all four sides by thin wire electrodes 43.

When a propagation path of a switching noise (a high-frequency noise) is indicated by an arrow A in FIG. 1A, the switching noise (the high-frequency noise) of the digital circuit 2 is prevented by the IDE-EBG 4 from entering the analog circuit 3.

The bridge portion 42 is a wire for DC current supply, and a power supply current can be adjusted by changing a wire width.

Figure 2A:
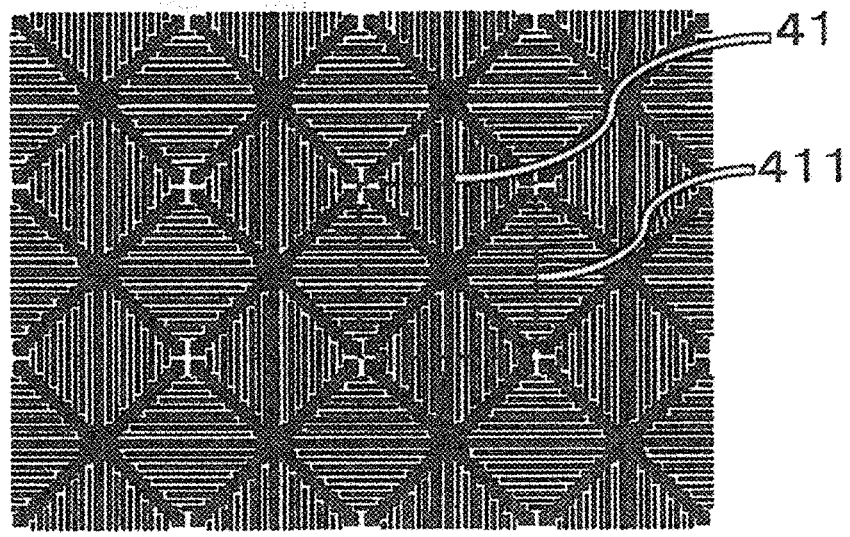
FIG. 2A is an explanatory diagram where two-dimensional IDE-EBG unit cells in FIG. 1B are arrayed with four cells in a horizontal line and three cells in a vertical line.
Figure 2B:
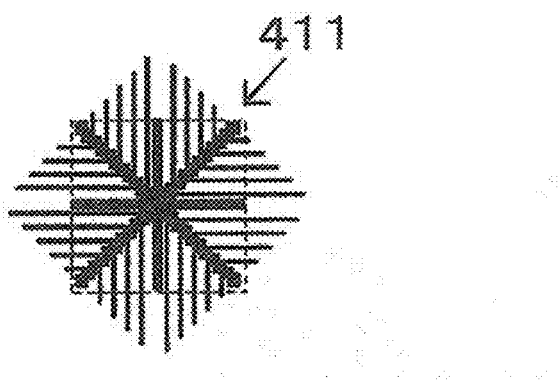
FIG. 2B is a partially enlarged diagram of FIG. 2A (adjacent EBG unit cells are not illustrated)

FIG. 2A illustrates a structure where the two-dimensional IDE-EBG unit cells 41 are disposed with four cells in a horizontal line and three cells in a vertical line. FIG. 2B is a partially enlarged diagram of the structure shown in FIG. 2A including cell 411 defined by the square shaped portion shown in FIG. 2A. More specifically, as illustrated in FIG. 2B, the two-dimensional IDE-EBG unit cell 411, of the two-dimensional IDE-EBG unit cells 41, does not include the thin wire electrodes 44 of the adjacent EBG unit cells 41 forming the interdigital electrodes. The two-dimensional IDE-EBG unit cells 41 are disposed on the printed wiring board two-dimensionally so as to form the interdigital electrodes on the boundaries with respect to adjacent two-dimensional IDE-EBG unit cells 41. The orientation of adjacent two-dimensional IDE-EBG unit cells 41 is depicted in FIG. 1C. For this reason, in the two-dimensional IDE-EBG unit cell 41, a capacitance (C2 in FIG. 3A) of the interdigital electrode to be formed between the adjacent EBG unit cells can be increased. The printed wiring board of the present invention thus can be made to be smaller than a printed wiring board having a typical planar EBG structure.

$$f = \frac{1}{2\pi\sqrt{L(C_1 + C_2)}} \qquad \text{[Mathematical Formula 1]}$$

The above mathematical formula 1 represents a low-band frequency f in a block band.

Figure 3A:
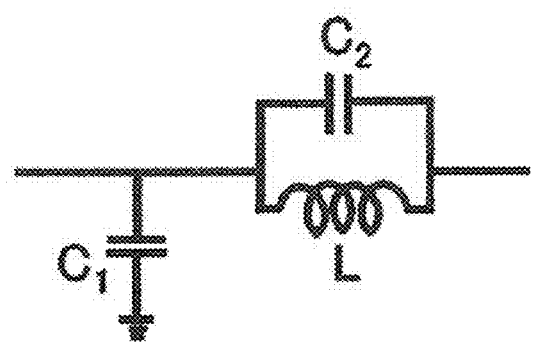
FIG. 3A is an equivalent circuit diagram for describing the principle of IDE-EBG unit cells in the present invention.

As illustrated in FIG. 3A, in EBG unit cells having the typical planar EBG structure, an inductance L in FIG. 3A is increased by elongating branches of the EBG unit cells into a spiral shape or a meander shape. In such a manner, the capacitance $C_1$ that decreases due to the downsizing is compensated, and thus the low-band frequency f in the block band expressed by the mathematical formula 1 is maintained at a desired frequency. In the printed wiring board according to one embodiment of the present invention, the interdigital electrode is formed between the adjacent EBG unit cells, and thus a capacitance $C_2$ in FIG. 3A is made to be sufficiently larger than the capacitance $C_1$ between the power supply layer and a GND layer of the EBG unit cells. As a result, the low-band frequency f in the block band is set to the desired frequency and a compact size can be realized regardless of a size of the EBG unit cells.

Figure 3B:
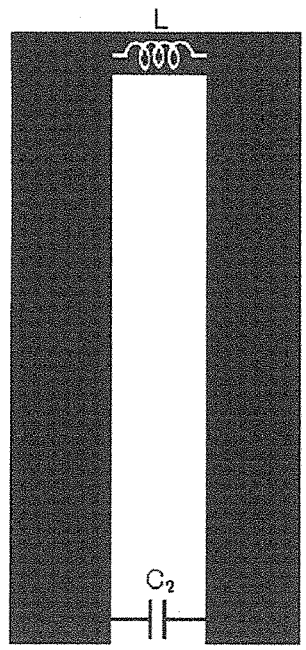
FIG. 3B is an explanatory diagram of capacitance between typical adjacent EBG unit cells.
Figure 3C:
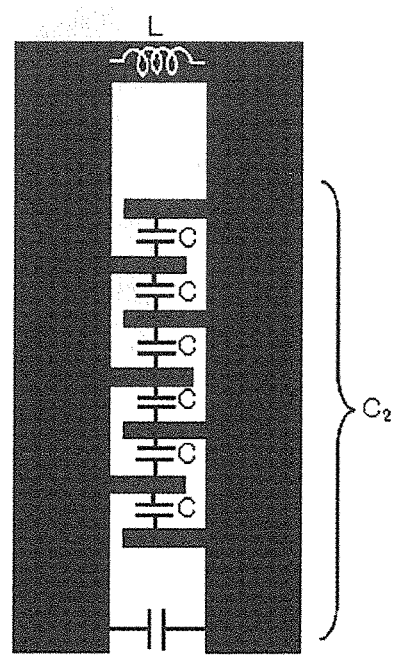
FIG. 3C is an explanatory diagram of capacitance when an interdigital electrode is formed between the adjacent EBG unit cells.

FIG. 3B illustrates the capacitance $C_2$ between the adjacent EBG unit cells when the EBG unit cells are spiral wires or meander lines that do not include the interdigital electrodes. Unlike the capacitance $C_2$ illustrated in FIG. 3B, the capacitance $C_2$ between the adjacent EBG unit cells of the interdigital electrodes illustrated in FIG. 3C can be made to be very larger than the capacitance $C_1$ in FIG. 3A because of an interdigital structure where a plurality of capacitances C between thin wire electrodes of the EBG unit cells and thin wire electrodes of adjacent EBG unit cells is added. For this reason, the low-band frequency f in the block band can be set regardless of the capacitance $C_1$.

A shape of the IDE-EBG 4 where the IDE-EBG unit cells 41 that form the interdigital electrodes are disposed two dimensionally is not particularly limited and thus is not necessarily a quadrate shape or a rectangular shape.

The frequency in the block band is decided by the IDE-EBG unit cells 41 but does not depend on their shape. For this reason, the shape of the IDE-EBG unit cells 41 does not have to be the quadrate shape or the rectangular shape. Thus the similar reducing effect can be obtained even in a triangular shape or a regular hexagon shape, for example.

A method of disposing the two-dimensional IDE-EBG unit cells 41 on the printed wiring board employs a structure in which a switching noise (high-frequency noise) that hinders an operation of an analog block (the analog circuit 3) is prevented from entering from an outside by disposing the IDE-EBG unit cells 41 around the analog block as an example. Another example is a structure in which a high-frequency digital noise that causes electromagnetic interference is prevented from leaking by disposing the IDE-EBG unit cells 41 around a digital block (the digital circuit 2).

Figure 4:
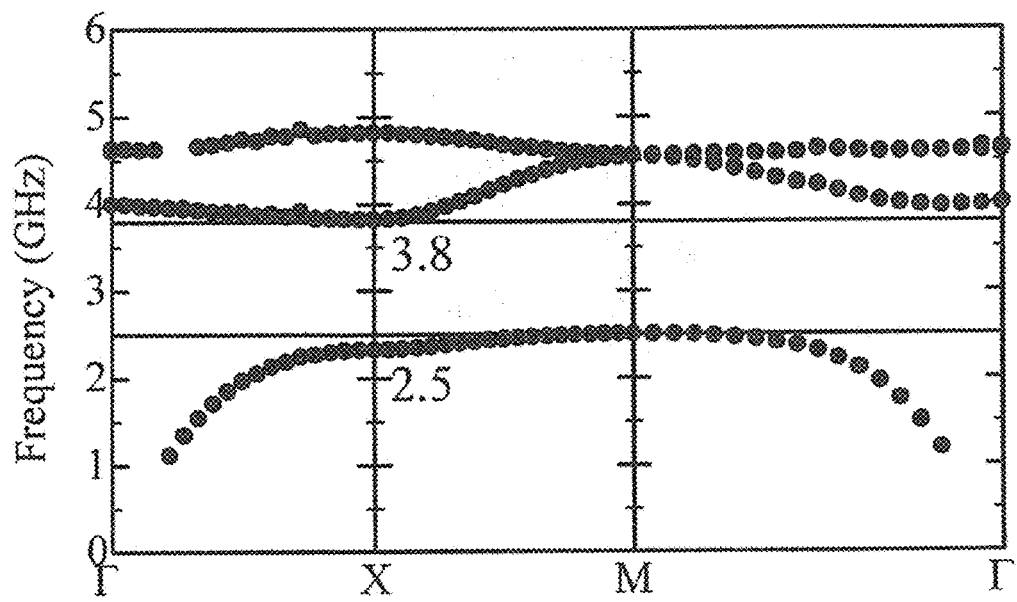
FIG. 4 is a graph illustrating a dispersion relationship obtained by electromagnetic field simulation in a case where the two-dimensional IDE-EBG unit cells forming the interdigital electrode between the adjacent EBG unit cells are disposed infinitely.

FIG. 4 illustrates a simulation result of a dispersion relationship of the IDE-EBG unit cells 41. As to the size of the IDE-EBG unit cells used for the simulation, each side of each two-dimensional IDE-EBG unit cell 41 illustrated in FIG. 1B has a size of 5.0 mm, a width of the bridge portion 42 is 0.25 mm, a width of the thin wire electrode 43 is 0.1 mm, and a width between the thin wire electrode 43 and the thin wire electrode 44 of the adjacent two-dimensional IDE-EBG unit cell is 0.1 mm.

A graph of the dispersion relationship illustrated in FIG. 4 indicates that a range between 2.5 GHz and 3.8 GHz is the block band. As illustrated in FIG. 1A, in the printed wiring board where the IDE-EBG 4 is disposed on the power supply layer 1 on the boundary between the digital circuit 2 and the analog circuit 3, a switching noise (a high-frequency noise) from the digital circuit 2 to the analog circuit 3 can be blocked in the band between 2.5 GHz and 3.8 GHz.

Another Embodiment

The printed wiring board according to another embodiment of the present invention is described with reference to FIGS. 5 and 6.

Figure 5A:
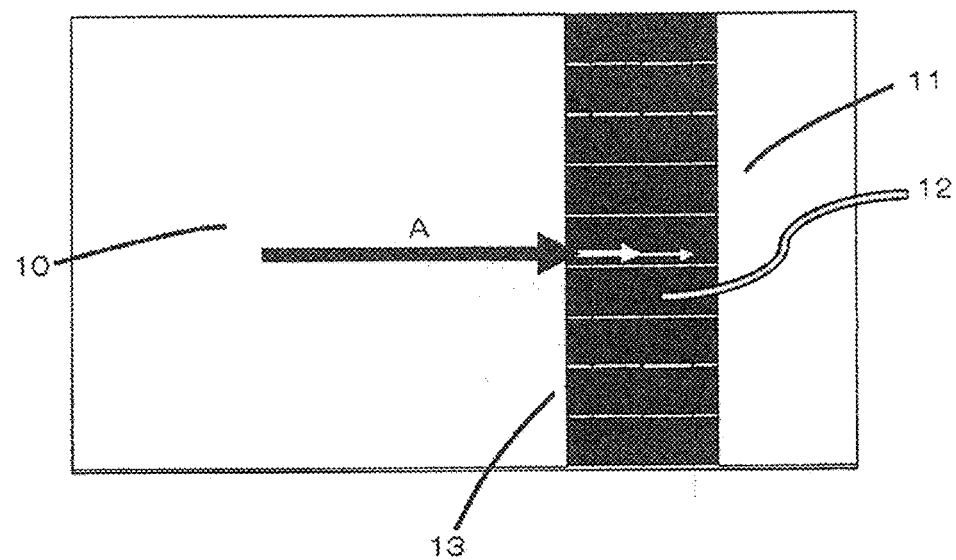
FIG. 5A is an explanatory diagram illustrating a printed wiring board according to another embodiment of the present invention where one-dimensional IDE-EBG unit cells are arrayed between the digital circuit and the analog circuit two-dimensionally.

FIG. 5A illustrates the printed wiring board that includes another IDE-EBG 12 in which one-dimensional IDE-EBG unit cells 121 are disposed between a digital circuit 10 and an analog circuit 11 two-dimensionally. The one-dimensional IDE-EBG unit cells 121 include interdigital electrodes formed between the thin wire electrodes of the adjacent EBG unit cells. The orientation of the IDE-EBG unit cells 121 is graphically depicted in FIG. 5C.

Figure 5B:
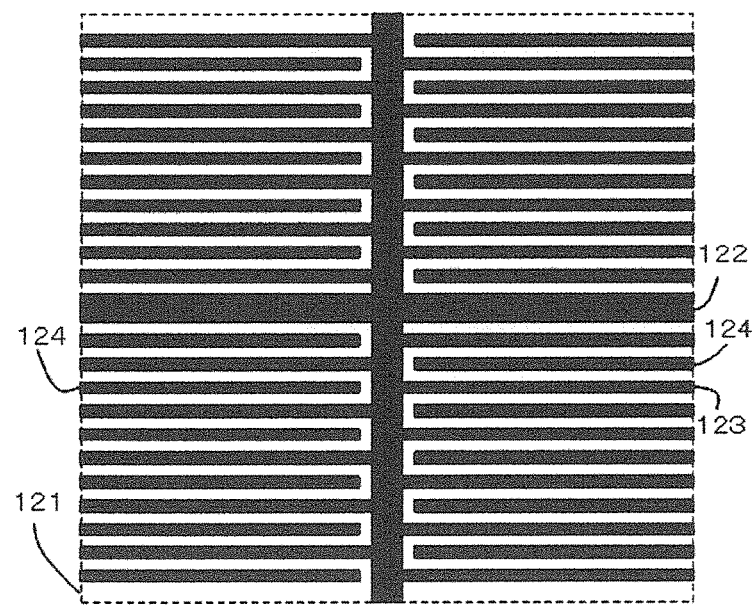
FIG. 5B is a partially enlarged diagram of FIG. 5A.
Figure 5:
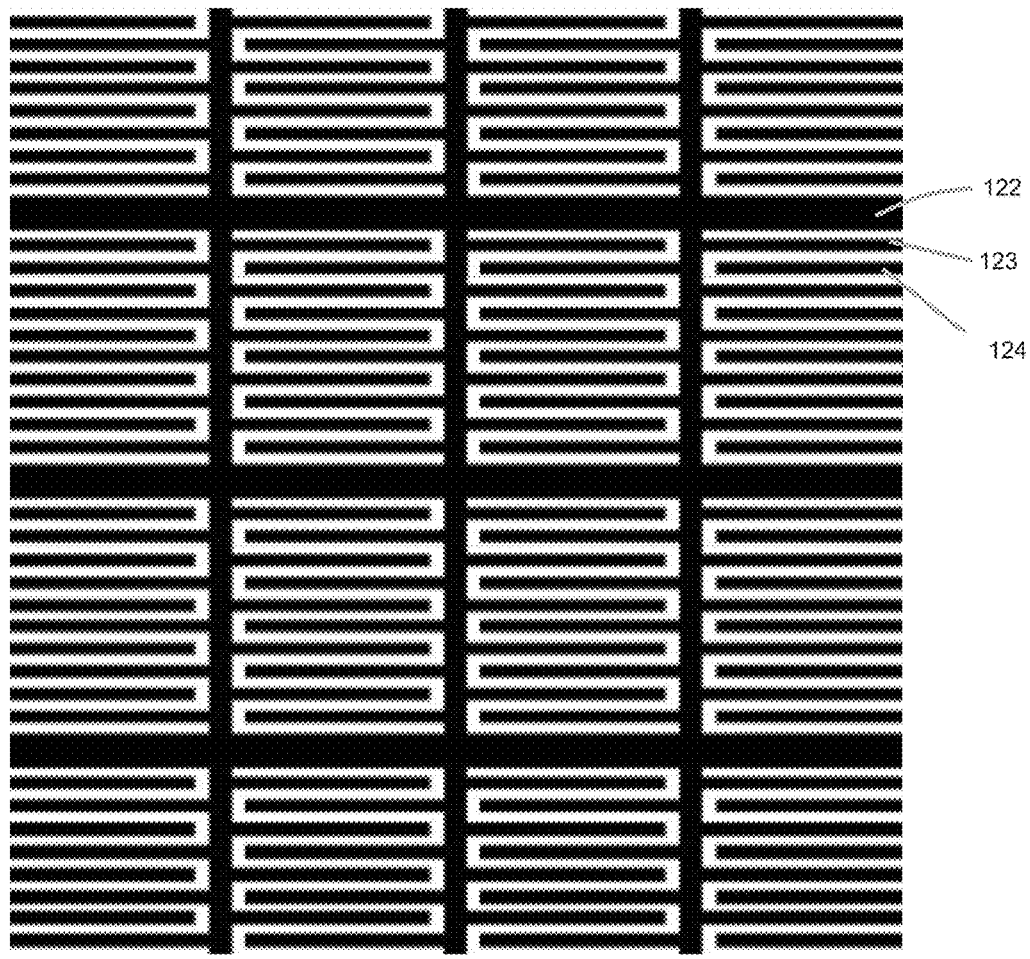
FIG. 5C is a partially enlarged diagram of FIG. 5A that depicts the interdigitated cells.

FIG. 5B illustrates the one-dimensional IDE-EBG unit cells where the interdigital electrode is formed between the adjacent EBG unit cells. A bridge portion 122 is wired so as to connect the adjacent EBG unit cells. A thin wire electrode 123 is the one-dimensional IDE-EBG unit cell 121 that is wired in parallel with the bridge portion 122.

The bridge portion 122 illustrated in FIG. 5B is a wire for DC power supply, and a power supply current quantity can be adjusted by changing a width of the wire. An interdigital electrode is formed by the thin wire electrode 123 and a thin wire electrode 124 of the adjacent one-dimensional IDE-EBG unit cells, and a capacitance (electrostatic capacity $C_2$ in FIG. 3A) of the interdigital electrode formed between the adjacent EBG unit cells can be increased.

Figure 6:
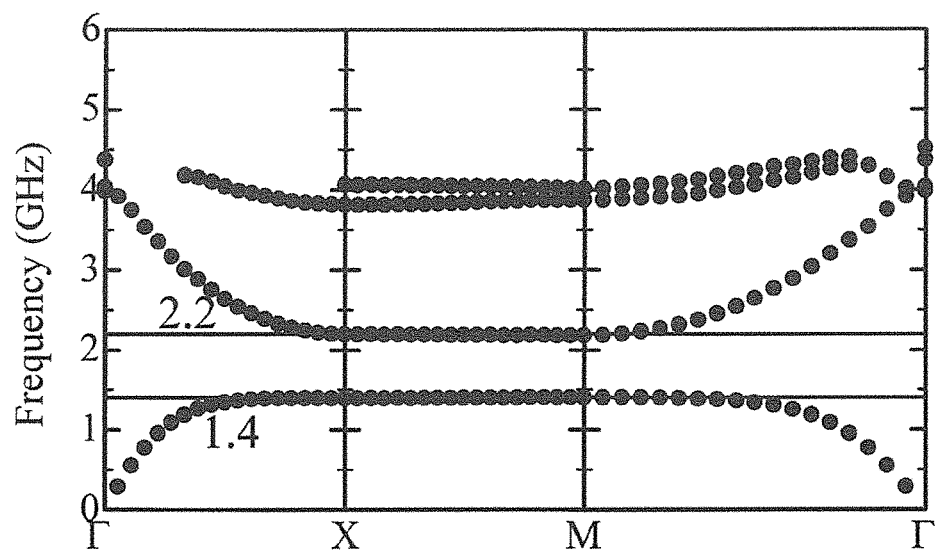
FIG. 6 is a graph illustrating the dispersion relationship obtained by electromagnetic field simulation in a case where the one-dimensional IDE-EBG unit cells forming the interdigital electrode between the adjacent EBG unit cells are disposed infinitely.

FIG. 6 illustrates a simulation result of the dispersion relationship of the IDE-EBG 12 in FIG. 5A. As to a size of the IDE-EBG unit cells used for the simulation, each side of each one-dimensional IDE-EBG unit cell 121 shown in FIG. 5B is 5.0 mm, a width of the bridge portion 122 is 0.25 mm, and a width of the thin wire electrode 123 is 0.1 mm.

A graph of the dispersion relationship illustrated in FIG. 6 indicates that the block band shown in FIG. 5A when the IDE-EBG 12 is disposed on a power supply layer 13 on the boundary between the digital circuit 10 and the analog circuit 11 is a band of 1.4 GHz to 2.2 GHz. In this band, the noise block effect produced by the IDE-EBG 12 enables propagation of the switching noise (high-frequency noise) from the digital circuit 10 to the analog circuit 11 to be decreased.

<Magnetic Body-Combined Structure>

In the printed wiring board of the present invention, a magnetic body is disposed by means such as application and film deposition, so that an effect is produced by a dielectric constant and magnetic permeability of the magnetic body. This structure is useful for a compact design using a wavelength shortening effect, improvement in a noise block amount in a block band, and widening the block band.

In a method of disposing the magnetic body, the magnetic body may be disposed on at least a part of the printed wiring board. Examples of the method include the following disposing methods (a) to (c).
(a) The magnetic body having the same shape as the shape of the interdigital electrode is partially disposed.
(b) The magnetic body is disposed avoiding the interdigital electrode.
(c) The magnetic body is disposed on an entire surface of the printed wiring board.

Each of The magnetic bodies may be made up of a single composition, and all the magnetic bodies may have the same thickness.

The magnetic body to be used in this embodiment preferably has a high-complex permeability component. As the magnetic body has a higher-complex permeability component, a volume of the magnetic body necessary for widening the block band is smaller.

The magnetic body preferably has high surface resistivity (preferably, $10^2$ $\Omega$/sq or more). The magnetic body having higher surface resistivity is less likely to cause a defect such that an electric circuit constant around the magnetic body fluctuates.

The magnetic body in this embodiment may be disposed by the means such as application or film deposition so as to contact an interdigital electrode, or may be disposed near the interdigital electrode via an adhesive layer. Examples of the magnetic body are a thin film having soft magnetism such as a ferrite thin film, magnetic paste obtained by dispersing powder having soft magnetism such as metal powder or ferrite powder onto a medium such as resin, and a ferrite sintered body. Among these examples, a thin ferrite plating film is the most preferable.

The thin ferrite plating film is created by a method of depositing a spinel ferrite material made up of a component $MFe_2O_4$ on a substrate. Examples of a metallic element M are Ni, Zn, Co, Mn, or Fe. In the ferrite plating, an aqueous solution that contains metal ions, including $Ni^{2+}$, $Zn^{2+}$, $Co^{2+}$, $Mn^{2+}$, and $Fe^{2+}$, is brought into contact with the surface of the substrate, and the substrate thereby adsorbs the metal ions. Then, $Fe^{2+}$ ion is oxidized with an oxidizer for example ($Fe^{2+} \rightarrow Fe^{3+}$). The metal ions react with hydroxide metal ions in the aqueous solution to create a ferrite crystal. As a result, the thin ferrite plating film is formed on the surface of the substrate. The ferrite plating is electroless plating using an aqueous solution process and enables a film to be formed directly on a resin film or a printed wiring board, for example. Therefore, with the ferrite plating, a film that exhibits both a relatively high surface resistivity and good magnetic characteristics can be formed without the use of a thermal treatment. A thin ferrite plating film can keep a higher permeability even in a high frequency band than a ferrite bulk or a complex made up of a magnetic power and a resin. The frequency characteristics of permeability in the ferrite plating thin film depend on the composition used therein. Therefore, the composition of a thin ferrite plating film may be selected on the basis of a frequency at which a standing wave is generated. An exemplary composition of a thin ferrite plating film is $Ni_{0.0 \text{ to } 0.4} Zn_{0.0 \text{ to } 0.5} Co_{0.0 \text{ to } 0.4} Mn_{0.0 \text{ to } 0.4} Fe_{2.0 \text{ to } 2.8} O_4$ (at least one of the metal elements Ni, Zn, Co, and Mn is not 0). This thin ferrite plating film can exhibit good high-frequency permeability characteristics and a high surface resistivity. A thin ferrite plating film having a larger thickness can have a wider block band. However, to ensure a wide block band and a firm adhesion to a main body, the thickness of the thin ferrite plating film is preferably in the range from 0.2 to 20 μm.

A method of producing a printed wiring board coated with a magnetic body will be described below. This producing method includes steps (1) to (6) that will be described below.
(1) A core board in which a power supply layer and a conducting layer are formed on the respective surfaces of an insulating plate is formed.
(2) A magnetic body is applied over an area of EBG structures disposed on the power supply layer that has been formed on the surface of the core board.
(3) A clearance is created in the part of the magnetic body in which a through-hole is to be formed so as to pass through the power supply layer.
(4) An insulating resin layer is stacked on a surface of the core board, and then another core board is stacked on an insulating resin layer.
(5) A through-hole pilot hole is formed across the core boards and the insulating resin layer with a laser or drill process.
(6) The inner surface of the through-hole pilot hole is coated with a plating layer.

A method of producing a printed wiring board of the present invention will be described with reference to FIGS. 7A to 7F.

Figure 7A:
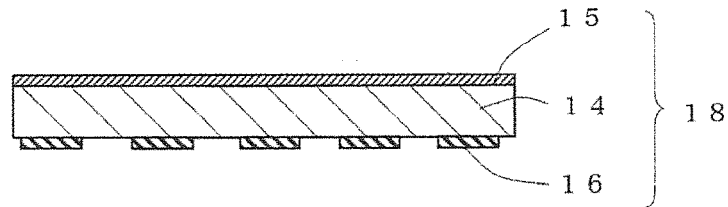
FIGS. 7A to 7F are cross-sectional views illustrating a method of producing a printed wiring board of the present invention.

Referring to FIG. 7A, a core board 18 has a structure in which a power supply layer 15 and a wire pattern 16 are formed on the respective surfaces of an insulating board 14.

The insulating board 14 may be made of any given insulating material. Examples of the insulating material include an epoxy resin, a bismaleimide triazine resin, a polyimide resin, a polyphenylene ether (PPE) resin, and any other organic resins. Two or more of such organic resins may be used in combination. When an organic resin is used for the insulating board 14, this organic resin preferably contains a reinforcing material. Examples of the reinforcing material include a glass fiber, a non-woven glass fabric, a non-woven aramid fabric, an aramid fiber, and a polyester fiber. Two or more of such reinforcing materials may be used in combination. The insulating board 14 is preferably made of organic resin containing a glass material such as a glass fiber. Further, the insulating board 14 may contain an inorganic filler, such as silica, barium sulfate, talc, clay, glass, calcium carbonate, and titanium oxide. The insulating board 14 may have any thickness, and the thickness is preferably 0.02 to 10 mm.

When EBG structures are formed in the power supply layer 15 and magnetic bodies are disposed between the power supply layer and the GND layer, a magnetic loss of the EBG structures is increased. When a penetrating through-hole is required, a magnetic body in which the through-hole would be formed is removed or no magnetic body is disposed in an area where the through-hole is to be formed.

To form the wire pattern 16, a photosensitive resist (e.g., a dry-film etching resist) is bonded to the insulating board 14 with roll laminating. Then, the photosensitive resist is exposed to light and developed, and a part of the photosensitive resist other than a circuit pattern is exposed. The exposed copper part is removed with etching. The etching liquid may be aqueous ferric chloride. When the dry-film etching resist is peeled off, the wire pattern 16 is formed. In this way, the core board 18 in which the wire pattern 16 is formed on the surface of the insulating board 14 is formed.

Figure 7B:
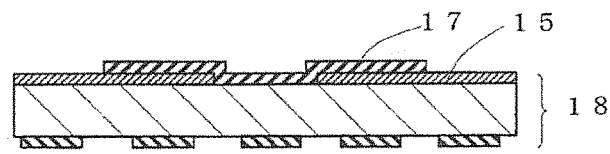

Thereafter, as illustrated in FIG. 7B, the regions of the power supply layer 15 in which the EBG structures (the IDE-EBG unit cells) have been formed are partially removed, and a magnetic body 17 is applied into a film shape for a through-hole, described later. The magnetic body 17 is preferably a thin ferrite plating film, as described above, having a thickness of 0.2 to 20 μm.

Figure 7C:
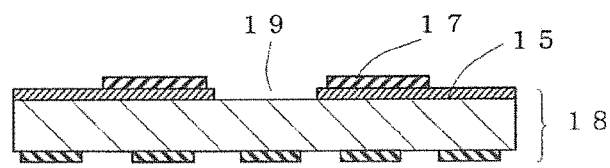

As illustrated in FIG. 7C, a clearance 19 is, then, created in the part of the magnetic body 17 in which the through-hole is to be formed across the power supply layer. Creating the clearance 19 can minimize the elution of the magnetic body 17 which would be caused by a copper plating liquid or a desmear liquid.

Figure 7D:
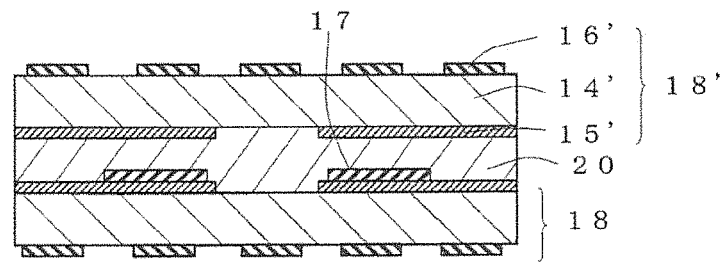

As illustrated in FIG. 7D, an insulating resin layer 20 is, then, stacked on the magnetic body 17. A core board 18', which has substantially the same configuration as the core board 18, is stacked on the insulating resin layer 20 with a wire pattern 16' facing outward.

To form the insulating resin layer 20, a prepreg is interposed between the core boards 18 and 18', and the core boards 18 and 18' are thermally compressed with a laminating press so that the prepreg is melted and cured.

Figure 7E:
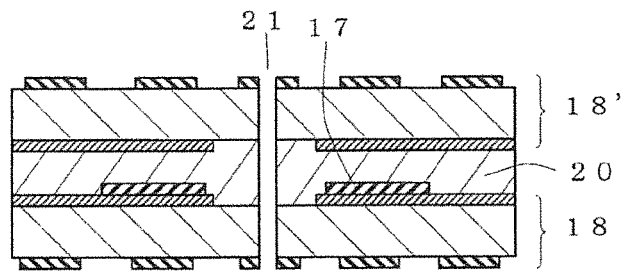

As illustrated in FIG. 7E, a through-hole pilot hole 21 is formed with a drill or laser, for example, so as to pass through the wire pattern 16', the insulating resin layer 20, and the wire pattern 16. The through-hole pilot hole 21 is formed in order to form a through-hole 23 through which the wire patterns 16 and 16' are electrically interconnected via the core board 18 and the power supply layer 15 in the core board 18 and the power supply layer 15' in the core board 18' are electrically interconnected.

After the through-hole pilot hole 21 has been formed, a thin resin film might be left on the surface of the through-hole pilot hole 21 and other surfaces. In this case, a desmear process is preferably executed. In the desmear process, the resin is swollen with a strongly-alkaline solution, and then decomposed and removed with an oxidizer (e.g., chromic acid or a permanganate solution). Alternatively, the resin film may be removed through a wet blasting process using an abrasive or a plasma process.

Figure 7F:
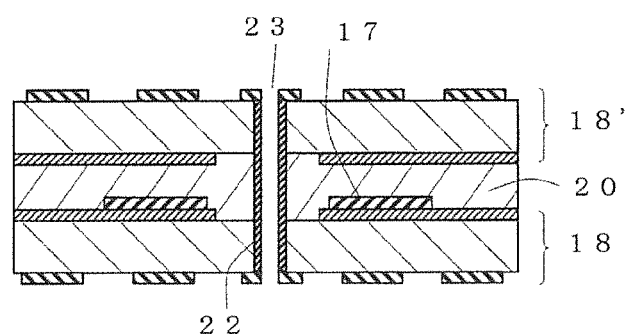

As illustrated in FIG. 7F, the inner surface of the through-hole pilot hole 21 is coated with a plated layer 22, so that a through-hole 23 is formed. The plated layer 22 is preferably formed with electroless or electrolytic copper plating. The electrolytic copper plating is preferred especially when a thick plated layer 22 is formed. The electrolytic copper plating makes it possible to form a plated layer 22 having a thickness of about 1 to 30 µm, for example.

Optionally, solder resists (not shown) may be formed on the surfaces of the core boards 18 and 18' at predetermined locations. To form the solder resists, photosensitive liquid solder resists are applied to the surfaces of the core boards 18 and 18' with spray coating, roll coating, curtain coating, or screen printing, for example, so that the photosensitive liquid solder resists each having a thickness of about 10 to 80 µm are formed. Then, the photosensitive liquid solder resists are dried. Alternatively, photosensitive-dry-film solder resists are bonded with roll laminating. Subsequently, the solder resists are exposed to light and developed whereby pad and other parts are opened. Then, the solder resists are thermally cured. After that, the exteriors of the core boards 18 and 18' and the like are processed. Through this processing, a printed wiring board of the present invention is produced.

In the above description, the printed wiring board of the present invention is exemplified by a typical multilayered printed wiring board. However, the printed wiring board of the present invention is not limited to the multilayered printed wiring board, and can be implemented using a build-up or other type of multilayered printed wiring board.

As described above, the IDE-EBG structures are disposed in a part of the power supply layer, and thus a direct current can be supplied to an IC through a typical part of the power supply layer. Further, when an electric current of high-frequency component flows in an IDE-EBG portion, resonance at a frequency depending on a shape of the IDE-EBG allows a high-frequency noise to be reflected, and thus noise propagation can be reduced.

Particularly in the structure where the digital circuit and the analog circuit share the power supply layer in a hybrid board, when electricity is supplied to the analog circuit through the bridge section in which the IDE-EBG is disposed, high-frequency noises generated in the digital circuit hardly propagate along the bridge section and only a necessary DC current can be supplied to the analog circuit.

Even in a structure having a plurality of digital circuit blocks, when the IDE-EBG structures are formed to surround the analog circuit where high-frequency noises are desired to be blocked, measure against noises can be taken.

A low-band frequency in a block band depends on a shape of the interdigital electrode to be formed between adjacent EBG unit cells.

A plurality of IDE-EBG unit cells is disposed according to a frequency at which noises are desired to be blocked, and thereby a block amount can be increased.

Since the block band can be set according to shapes of the interdigital electrode, use of a plurality of IDE-EBG unit cells in various block bands enables IDE-EBG with various block bands to be disposed. For example, in a wireless communication device or the like, measure against noise in a plurality of frequencies can be collectively realized on a printed wiring board using a plurality of communication frequencies.

In the printed wiring board according to the embodiment of the present invention, the interdigital electrode is formed between the adjacent EBG unit cells, and thus the EBG unit cells can be downsized. One-dimensional or the two-dimensional and periodical arrangement of the EBG unit cells causes reflection or absorption of a high-frequency noise to be generated in the digital circuit, and thus can prevent the noise from entering the analog circuit.

Further, when the magnetic body film is formed over the printed wiring board, partially formed on a part of the EBG unit cells, or formed avoiding the EBG unit cells, a high-frequency noise can be securely prevented from entering the analog circuit.

The present invention is not limited to the above embodiment, and can be modified and varied in various ways within the scope of the claims.

What is claimed is:

1. A printed wiring board comprising:
    a digital circuit;
    an analog circuit;
    a power supply path disposed on an insulating layer between the digital circuit and the analog circuit; and
    a plurality of electromagnetic band gap unit cells, that are arranged periodically adjacent to each other in a boundary between the digital circuit and the analog circuit, and each of the plurality of electromagnetic band gap unit cells includes:
        a bridge portion that forms part of the power supply path to supply DC current, wherein the bridge portion of electromagnetic band gap unit cells that are adjacent are electrically interconnected, and
        a plurality of thin wire electrodes that extend along an insulating layer surface from the bridge portion, wherein interdigital electrodes that are formed by entering mutually the plurality of thin wire electrodes in a noncontact manner with the thin wire electrodes of the electromagnetic band gap unit cells that are adjacent.

2. The printed wiring board according to claim 1, wherein each of the electromagnetic band gap unit cells does not have a via for connecting to another layer.

3. The printed wiring board according to claim 1, wherein a shape of each of the electromagnetic band gap unit cells is one selected from a quadrate shape, a rectangular shape, a triangular shape, and a regular hexagon shape.

4. The printed wiring board according to claim 1, wherein a magnetic body film is formed over the printed wiring board, partially formed on the electromagnetic band gap unit cells, or formed avoiding the electromagnetic band gap unit cells.

5. The printed wiring board according to claim 4, wherein the magnetic body film is a thin ferrite plating film.

6. The printed wiring board according to claim 4, wherein the magnetic body film has a thickness of 0.2 µm to 20 µm.

7. The printed wiring board according to claim 1, wherein the electromagnetic band gap unit cells are disposed around the digital circuit periodically.

8. The printed wiring board according to claim 1, wherein the electromagnetic band gap unit cells are disposed around the analog circuit periodically.

9. A method of producing a printed wiring board comprising:
    disposing a power supply path on an insulating layer between a digital circuit and an analog circuit;
    disposing a plurality of electromagnetic band gap unit cells, wherein the plurality of electromagnetic band gap unit cells are arranged periodically adjacent to each other in a boundary between the digital circuit and the analog circuit, and each of the plurality of electromagnetic band gap unit cells includes:
        a bridge portion that forms part of the power supply path to supply DC current, wherein the bridge portion of electromagnetic band gap unit cells that are adjacent are electrically interconnected, and a plurality of thin wire electrodes that extend along an insulating layer surface from the bridge portion, wherein the plurality of thin wire electrodes enter mutually in a noncontact manner with the thin wire electrodes of the electromagnetic band gap unit cells that are adjacent to form interdigital electrodes; and forming a magnetic body film on the electromagnetic band gap unit cells.

* * * * *